United States Patent

Unger et al.

[11] Patent Number: 6,104,090
[45] Date of Patent: Aug. 15, 2000

[54] INTEGRATED CIRCUIT SUBASSEMBLY WITH THERMALLY ANISOTROPIC HEAT TRANSFER ELEMENT

[75] Inventors: Scott M. Unger, Morgan Hill; Guy T. Riddle, Manteca, both of Calif.

[73] Assignee: Bryte Technologies, Inc., San Jose, Calif.

[21] Appl. No.: 09/097,844

[22] Filed: Jun. 15, 1998

Related U.S. Application Data

[62] Division of application No. 08/621,176, Mar. 21, 1996, Pat. No. 5,834,337.

[51] Int. Cl.[7] .............................. B32B 9/00; B32B 5/16; H01L 21/44
[52] U.S. Cl. .................... 257/729; 257/706; 257/703; 257/705; 257/730; 257/712; 257/704; 257/710; 257/677; 428/195; 428/336; 428/323
[58] Field of Search ................... 257/706, 705, 257/712, 707, 713, 677, 710, 796, 729, 717, 730, 720, 704, 703; 428/195, 336, 323; 438/122, 125

[56] References Cited

U.S. PATENT DOCUMENTS

| | | | |
|---|---|---|---|
| 4,215,161 | 7/1980 | Siebold et al. | 427/228 |
| 4,216,262 | 8/1980 | Goan | 428/367 |
| 4,265,968 | 5/1981 | Prewo | 428/336 |
| 4,466,996 | 8/1984 | Boxall et al. | 427/122 |
| 4,526,911 | 7/1985 | Boxall et al. | 523/445 |
| 4,720,424 | 1/1988 | Erekmon et al. | 428/323 |
| 4,737,540 | 4/1988 | Yoshida et al. | 524/537 |
| 4,882,089 | 11/1989 | Iwaskow et al. | 428/242 |
| 5,132,394 | 7/1992 | Bockrath | 528/353 |
| 5,229,202 | 7/1993 | Tomono et al. | 428/288 |
| 5,254,409 | 10/1993 | Yagi et al. | 428/392 |
| 5,288,537 | 2/1994 | Corden | 438/91 |
| 5,654,059 | 8/1997 | Hezht | 428/65.9 |
| 5,660,917 | 8/1997 | Fujimori et al. | 428/392 |
| 5,708,297 | 1/1998 | Clayton | 257/723 |

*Primary Examiner*—Alexander Williams
*Attorney, Agent, or Firm*—Townsend and Townsend and Crew LLP

[57] ABSTRACT

An integrated circuit heat transfer element (6,30) is made by selecting thermally conductive fibers having aspect ratios of length to diameter of more than 1, selecting a resin and combining the fibers and the resin to create a formable resin/fiber compound. The resin/fiber compound is formed into a composite material in part by applying pressure to the formable resin/fiber compound, which aligns the fibers, and when cured creates a thermally anisotropic composite material to maximize heat conduction along the aligned fibers. The thermally anisotropic composite material has a coefficient of thermal expansion (CTE) of less than about $10 \times 10^{-6}$ cm/cm/° C. The composite material has a thermal conductivity in the direction of the carbon fibers of at least 50 W/m° K. The IC device is preferably secured to the heat transfer element using a thermally conductive adhesive.

15 Claims, 1 Drawing Sheet

INTEGRATED CIRCUIT SUBASSEMBLY WITH THERMALLY ANISOTROPIC HEAT TRANSFER ELEMENT

CROSS-REFERENCE TO RELATED APPLICATION

This is a divisional patent application of application Ser. No. 08/621,176, filed Mar. 21, 1996, entited Integrated Circuit Heat Transfer Element and Method, now U.S. Pat. No. 5,834,337, the disclosure of which is incorporated by reference.

BACKGROUND OF THE INVENTION

Many integrated circuit (IC) devices, such as microprocessors, generate enough heat so that heat dissipation is a concern. In many applications, heat transfer elements of the type called heat slugs and heat spreaders are attached directly to the backside of the integrated circuit device to spread and remove heat away from the device. Conventional heat slugs and heat spreaders are typically made of copper, copper/molybdenum alloys or copper/tungsten alloys.

One of the problems with using copper is its high ($17 \times 10^{-6}$ cm/cm/° C.) coefficient of thermal expansion (CTE) versus the much lower CTE ($5–6 \times 10^{-6}$ cm/cm/° C.) for silicon and the IC circuit device. This CTE mismatch requires that elastomeric silicone adhesives and uncured thermal greases be used to attach the heat transfer element to the IC device. Doing so prevents the IC subassembly from being destroyed by thermal stresses when undergoing thermal cycles. However, the use of elastomeric silicone adhesives and uncured thermal greases creates reliability problems due to inherently poor bond strength. In addition, silicone-based products are poor thermal conductors and restrict heat transfer away from the IC device.

To alleviate the problems caused by the CTE mismatch, copper/tungsten and copper/molybdenum alloys can be used. The CTE match for these alloys is much closer to that of silicon and ceramic substrates, $6.7–9.0 \times 10^{-6}$ cm/cm/° C. versus $5–6 \times 10^{-6}$ cm/cm/° C. The closer CTE match permits a more intimate bond, which allows greater thermal conduction. However, these alloys are quite expensive, thus substantially increasing the cost to the ultimate purchaser.

Another problem with conventional, copper-based, heat transfer elements is that they are heavy. While for standalone units this may not be a problem, it is a substantial concern when dealing with computers and other electronic devices for which weight is an important consideration because, for example, they are carried about by the user.

Some electronic devices are low powered and therefore have very low heat outputs. These devices very often have lids molded in place using a polymeric molding compound, typically an epoxy filled with spherical quartz. Although cost-effective, the low thermal conductivity of these molding compounds means that they do not transfer heat very well and thus are totally unsuited for IC devices which generate substantial amounts of heat, such as microprocessors. Rather, lids for high-powered microprocessors are typically made from aluminum or an aluminum/ceramic composite material. The ceramic materials are added to decrease the CTE of the aluminum to a level closer to that of silicon. The lids are typically bonded in place using a hermetic solder, silicon adhesive or other polymeric adhesive.

One of the problems with the conventional aluminum lids is that the CTE is $24 \times 10^{-6}$ cm/cm/° C. requiring elastomeric silicon adhesives and uncured thermal greases to be used between the lid and the IC device. This creates the same type of problems as discussed above with reference to heat slugs and heat spreaders. With aluminum/ceramic composite lids the thermal conductivity is relatively low compared to pure aluminum but the manufacturing processes used to make the hardware are more difficult than with aluminum-based hardware.

SUMMARY OF THE INVENTION

The present invention is directed to an integrated circuit heat transfer element and method having a similar CTE as the IC device to permit the use of high strength, reliable, high thermal conductivity adhesives to secure the heat transfer element to the IC device. The heat transfer element is made of a thermally anisotropic composite material including thermally conductive fibers oriented generally perpendicular to the IC device for enhanced heat transfer from the IC device. In addition, the invention permits heat transfer elements to be made much lighter than equivalent metallic heat transfer elements.

The heat transfer element is made by selecting thermally conductive fibers, typically carbonaceous fibers, at least 30% having aspect ratios of length to diameter of more than 1, selecting a resin and combining the fibers and the resin to create a formable resin/fiber compound. The resin/fiber compound is formed into a composite material in part by applying pressure to the resin/fiber compound to create a thermally anisotropic composite material in which the fibers are generally aligned in a chosen direction to maximize heat conduction along the chosen direction.

The thermally anisotropic composite material preferably has a coefficient of thermal expansion (CTE) of less than about $10 \times 10^{-6}$ cm/cm/° C., more preferably has a CTE within about 60% of the CTE of the IC device, and most preferably has about the same CTE as the IC device, that is about $5–6 \times 10^{-6}$ cm/cm/° C. The fibers are preferably graphite fibers but could be other carbonaceous fibers or fibers coated with thermally conductive materials such as nickel, silver, gold, diamond or ceramics. As used herein, carbonaceous fibers include fibers which start out being carbon, or substantially carbon, as well as fibers which are made of carbon precursors and can be transformed into carbon during an oxygen-free heating step. In the latter case, the resin can also be a carbon precursor resin so that after the oxygen-free heating step, the composite material is a carbon/carbon composite for further enhanced thermal conductivity.

The composite material has its thermally conductive fibers aligned by applying pressure to the resin/fiber compound while still in its formable state. This can be achieved by procedures such as cavity molding under pressure and by extrusion. The heat transfer elements can be pressed singly in a compression molding process or in a multiple cavity tool using a transfer molding process. The molds would typically be heated to above about 175° C. (350° F.) and molded at pressures of about 1 to $2 \times 10^{-8}$ dynes/cm² (1,500–3,000 psi).

The resin/fiber compound is preferably extruded at temperatures of 190–200° C. and pressures of 1500–3000 psi. The heat transfer elements can be created from the extruded resin fiber compound by cutting slices of the extruded resin/fiber compound and then machining surfaces as needed.

The resultant composite material preferably has a thermal conductivity in the direction of the thermally conductive fibers of at least 50 W/m° K and a density of less than about 3 gm/cc, and more preferably less than about 2.3 gm/cc.

Different types of integrated circuit assemblies are made with the heat transfer element adjacent to the IC device and with the thermally conductive fibers oriented generally perpendicular to the IC device for enhanced thermal conductivity away from the IC device. The heat transfer element can take a number of forms, including a heat slug or heat spreader when, for example, the IC assembly is part of a wire bonded IC assembly design. Alternatively, the heat transfer element can be formed as a thermally conductive chip lid in, for example, a ball grid array design of an IC assembly. The heat transfer element can also be made as an integral part of a heat sink used with either of the wire bonded and ball grid array designs.

The IC device is preferably secured to the heat transfer element using a non-elastomeric, thermally conductive adhesive. The heat transfer element can be plated with a metal if desired.

Other features and advantages will appear from the following description in which the preferred embodiment has been set forth in detail in conjunction with the accompanying drawings.

DESCRIPTION OF THE PREFERRED EMBODIMENT AND METHOD

Figure 1:
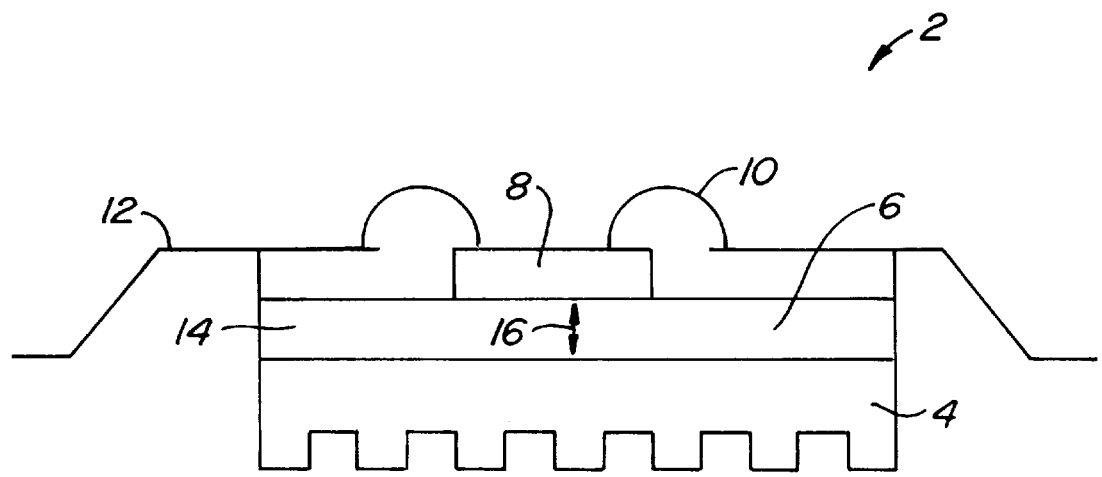
FIG. 1 is a simplified view of a wire bond design of an integrated circuit assembly.

FIG. 1 illustrates a typical IC assembly 2 of the wire bonded design. IC assembly 2 includes a heat sink 4 to which a heat slug or heat spreader 6 is mounted. An IC device 8, such as a microprocessor, is positioned on top of heat transfer element 6. Wire bonds 10 extend from IC device 8 to a copper lead frame 12. A ceramic substrate 14 overlies heat sink 4 in areas other than heat transfer element 6.

The above-described IC assembly 2 is generally conventional. With conventional IC assembly 2, heat transfer element 6 is typically copper requiring an elastomeric silicon adhesive or an uncured thermal grease to be used between IC device 8 and heat transfer element 6. When an elastomeric adhesive is used, the bond between IC device 8 and heat transfer element 6 is not very strong; in addition, the elastomeric adhesive is a fairly good thermal insulator, thus reducing the heat transfer from IC device 8, through heat transfer element 6 and into heat sink 4. When thermal greases are used, which enhances heat transfer between IC device 8 and heat transfer element 6, bonding between IC device 8 and heat transfer element 6 is substantially nonexistent.

According to the present invention, heat transfer element 6 is a thermally anisotropic composite material in which thermally conductive fibers, typically graphite fibers, are aligned generally along a chosen direction 16. Direction 16 is generally perpendicular to IC device 8 so to maximize heat conduction along the chosen direction and thus away from the IC device.

To create a heat transfer element 6 made according to the invention, graphite fibers having aspect ratios of length to diameter of more than 1 are selected. The aspect ratio selected will usually vary from more than 1 to about 200 depending on the degree of thermal anisotropy desired. Other thermally conductive fibers, including carbonaceous fibers made of carbon precursor materials and fibers coated with thermally conductive materials such as nickel, silver, gold, diamond or ceramics, can be used instead of graphite fibers. The graphite fibers are combined with a suitable resin to create a formable resin/fiber compound. Examples of suitable resins include epoxy, cyanate ester, phenolic, phenolic triazine cyanate esters, bismaleimide and polyimide. The formable resin/fiber compound is then formed (typically through the application of heat and pressure) to create the desired thermally anisotropic composite material.

The alignment of the carbon fibers is achieved by applying pressure to the resin/fiber compound while still in its formable state which causes the fibers to align in a direction generally perpendicular to the direction of pressure during cure. Each transfer element 6 can be created in a compression molding process or a multiple cavity tool using a transfer molding process. The molds would typically be heated to above 350° F. and the parts would be molded at pressures between about 1,500 and 3,000 psi. Another method of manufacturing heat transfer elements would be to press or extrude long, constant-profile bars of the resin/fiber compound to create elongate bars of thermally anisotropic composite material. The bars could then be sliced to the proper thickness and, if necessary, further machined or worked to the proper shape or form.

Heat transfer element 6 can be plated with copper, silver, gold or another thermally conductive metal, ceramic or polymer. This helps to ensure the heat transfer element remains sealed to ensure cleanliness in the application of the typically graphite fiber-based heat transfer element. Such plating or sealing may not always be required depending on the particular application.

Heat sink 4 can also be manufactured using a thermally anisotropic composite material as discussed above with reference to heat transfer element 6. In some situations, heat transfer element 6 and heat sink 4 could be a single, one-piece part.

Figure 2:
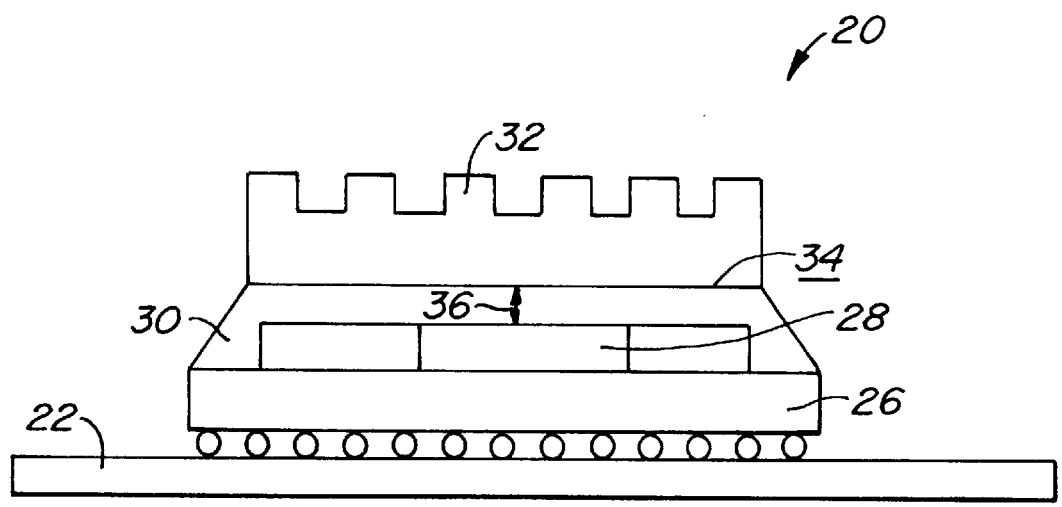
FIG. 2 is a simplified view of a ball grid array design of an integrated circuit assembly.

FIG. 2 illustrates an IC assembly 20 of a ball grid array design. Assembly 20 is mounted on a printed wiring board 22 by solder balls 24. Assembly 20 includes a ceramic substrate 26 to which an IC device 28 is mounted. Heat transfer element 30 is in the form of a chip lid and is conventionally made of, for example, aluminum. Chip lid 30 is conventionally secured to ceramic substrate 26 using a silicone adhesive to alleviate CTE mismatch problems. A silicone thermal grease, used for improved heat transfer, is used between heat-generating IC device 28 and chip lid 30. Heat sink 32 is secured to the upper surface 34 of heat transfer element 30. With conventional IC assemblies 20, heat sink 32 is typically aluminum.

With the present invention, chip lid 30 is made of thermally anisotropic composite material having graphite fibers oriented generally perpendicular to heat transfer element 6, that is in direction of arrows 36, using the method discussed above. Further, heat sink 32 could be made using the same type of thermally anisotropic composite material. Also, as discussed with preference to FIG. 1, heat transfer element 30 and heat sink 32 could be made as a one-piece, unitary structure.

A thermally anisotropic composite material from which heat transfer elements 6, 30 are made can also be made using carbon fiber/carbon matrix molded parts. The process used to make the parts would be identical to the steps discussed above. After the part is formed and/or then machined, the parts would be carbonized in an inert (for example, nitrogen) atmosphere furnace or vacuum furnace. During the carbonization process, which involves heating the parts to temperatures above 1,000° F., typically above 1500° F., the carbonaceous resin in the part will convert from its current state (carbon precursors or carbon and carbon precursors) into a carbon state. To reduce the voids in the parts and to ensure suitable structure or strength, a char yield of at least about 50% by weight (and more preferably at least about 60% by weight) is desired. That is, the mass of the resin (typically phenolic or phenolic triazine cyanate esters) before carbonization should be no more than twice the mass of carbon created by the carbonization of the resin. The carbon matrix/carbon fiber part can then be plated (e.g., using electroless plating techniques) to seal the surface and add a degree of extra toughness to the part. Using the carbon fiber/carbon matrix option creates a heat transfer element which has a lower CTE in the direction perpendicular to that of the fibers as opposed to the same part before the carbonization step. In addition, the thermal conductivity in the direction perpendicular to the direction of the fibers will increase due to the increase in the amount of more highly conductive carbon matrix versus the less highly conductive carbon precursor matrix.

Modification and variation can be made to the disclosed embodiments and methods without departing from the subject of the invention as defined in the following claims. For example, it is preferred that all of the fibers have aspect ratios of more than 1; however, the invention is also intended to cover situations in which at least 30% have aspect ratios more than 1.

What is claimed is:

1. An integrated circuit subassembly comprising:
   an integrated circuit (IC) device having a first CTE;
   a heat transfer element, comprising a thermally anisotropic composite material with a second CTE adjacent said IC device; and
   said composite material comprising thermally conductive fibers oriented generally perpendicular to said IC device, at least 30% of said fibers having aspect ratios of length to diameter of greater than 1.

2. The subassembly according to claim 1 wherein said second CTE is within 60% of the first CTE.

3. The subassembly according to claim 1 wherein said first and second CTE's are about $5-6\times10^{-6}$ cm/cm/° C.

4. The subassembly according to claim 1 wherein said second CTE is less than about $10\times10^{-6}$ cm/cm/° C.

5. The subassembly according to claim 1 wherein said heat transfer element comprises a heat slug.

6. The subassembly according to claim 1 wherein said heat transfer element comprises a chip lid.

7. The subassembly according to claim 1 wherein said heat transfer element has a thermal conductivity in a direction generally perpendicular to said IC device of at least 50 W/m° K.

8. The subassembly according to claim 1 wherein said thermally conductive fibers comprise carbonaceous fibers and said composite material comprises said carbonaceous fibers within a matrix.

9. The subassembly according to claim 8 wherein said matrix is at least 60% carbon by weight.

10. The subassembly according to claim 1 wherein said heat transfer element comprises a thermally conductive layer covering said composite material.

11. The subassembly according to claim 1 further comprising a thermally conductive adhesive securing said IC device to said heat transfer element.

12. The subassembly according to claim 11 wherein said adhesive is a non-elastomeric material.

13. The subassembly according to claim 11 wherein said adhesive is selected from the following group: cyanate esters, epoxy, silicone, polyimide or bismaleimide.

14. An integrated circuit subassembly comprising:
   an integrated circuit (IC) device having a first CTE;
   a heat transfer element, comprising a thermally anisotropic composite material with a second CTE adjacent said IC device;
   said second CTE being less than about $10\times10^{-6}$ cm/cm/° C.;
   a thermally conductive adhesive securing said IC device to said heat transfer element;
   said composite material comprising carbon fibers oriented generally perpendicular to said IC device; and
   said heat transfer element having a thermal conductivity in a direction generally perpendicular to said IC device of at least 50 W/m° K.

15. The subassembly according to claim 14 wherein said composite material comprises said carbon fibers within a matrix which is at least 60% carbon by weight.

* * * * *